(12) United States Patent
Sanchez et al.

(10) Patent No.: US 7,872,356 B2
(45) Date of Patent: Jan. 18, 2011

(54) DIE STACKING SYSTEM AND METHOD

(75) Inventors: Hen Sanchez, Carlsbad, CA (US);
Laxminarayan Sharma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 11/964,188

(22) Filed: Dec. 26, 2007

(65) Prior Publication Data
US 2008/0283993 A1    Nov. 20, 2008

Related U.S. Application Data

(60) Provisional application No. 60/938,365, filed on May 16, 2007.

(51) Int. Cl.
*H01L 23/48* (2006.01)
(52) U.S. Cl. ............ 257/777; 257/686; 257/778
(58) Field of Classification Search ............ 257/686, 257/778, 777
See application file for complete search history.

(56) References Cited

U.S. PATENT DOCUMENTS

| | | | |
|---|---|---|---|
| 7,034,388 B2 | 4/2006 | Yang et al. | |
| 7,095,105 B2 | 8/2006 | Cherukuri et al. | |
| 7,218,006 B2 | 5/2007 | Kang et al. | |
| 7,279,795 B2* | 10/2007 | Periaman et al. | ............ 257/777 |
| 2004/0115867 A1* | 6/2004 | Shibata | ............ 438/125 |

FOREIGN PATENT DOCUMENTS

| | | |
|---|---|---|
| WO | 2005034238 | 4/2005 |
| WO | 2007000697 | 1/2007 |

OTHER PUBLICATIONS

International Search Report—PCT/US2008/063993, International Searching Authority—European Patent Office—Sep. 2, 2008.
Written Opinion—PCT/US2008/063993, International Searching Authority—European Patent Office—Sep. 2, 2008.

* cited by examiner

*Primary Examiner*—N Drew Richards
*Assistant Examiner*—Yu-Hsi Sun
(74) *Attorney, Agent, or Firm*—Sam Talpalatsky; Nicholas J. Pauley; Jonathan T. Velasco

(57) ABSTRACT

Die stacking systems and methods are disclosed. In an embodiment, a die has a surface that includes a passivation area, at least one conductive bond pad area, and a conductive stacked die receiving area sized to receive at least a second die.

39 Claims, 4 Drawing Sheets

DIE STACKING SYSTEM AND METHOD

I. FIELD OF THE DISCLOSURE

The present disclosure is generally directed to die stacking.

II. BACKGROUND

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, wireless telephones can process executable instructions, including software applications, such as a web browser application, that can be used to access the Internet. As such, these wireless telephones can include significant computing capabilities.

Typically, the computing capabilities of such devices may be provided by multiple semiconductor devices, where each semiconductor device includes a die having specialized circuitry. Two or more dies, such as a die with modem circuitry and a die with communications circuitry, may be stacked on a substrate in a package. One typical method of stacking dies uses a conductive spacer layer between a host die and a stacking die. The conductive spacer layer electrically connects to the bottom of the stacking die but does not electrically connect to the top of the host die due to a protective passivation layer on the surface of the host die. Wire bonds are used to connect the staked die, the conductive spacer layer, and the host die to conductive pads on the package substrate. However, this stacking method can be difficult and expensive due to increased assembly process steps and packaging costs. In addition, typical spacer materials, such as a conductive aluminum surface layer on a silicon spacer, do not fasten well to packaging materials such as die attachment material and mold compound.

III. SUMMARY

In a particular embodiment, a semiconductor device is disclosed. The semiconductor device includes a first die having a surface that includes a passivation area, at least one conductive bond pad area, and a large conductive area. For example, the large conductive area may be at least 10,000 square microns.

In another embodiment, a die stacking system is disclosed that includes a first die that has a surface including a passivation area, at least one conductive bond pad area, and a conductive stacked die receiving area. The conductive stacked die receiving area is sized to receive at least a second die.

In another embodiment, a device includes a first die. The first die has a surface that includes a passivation area, at least one conductive bond pad area, and a conductive die receiving area sized to receive at least one conductive coupling element to be coupled to a second die.

In another embodiment, a package that includes a plurality of semiconductor devices is disclosed. The package includes a first die having a surface that includes a passivation area, at least one conductive bond pad area, a first large conductive area of at least 10,000 square microns, and a second large conductive area of at least 10,000 square microns. The package also includes a second die in contact with at least a portion of the first large conductive area. The package further includes a third die in contact with at least a portion of the second large conductive area.

In another embodiment, a system is disclosed that includes a flip-chip mounted device including a first die coupled to a second die. The system also includes a third die coupled to the second die. The third die has a surface that includes a passivation area, at least one conductive bond pad area, and a conductive stacked die receiving area sized to receive at least a fourth die.

One particular advantage provided by the disclosed embodiments is reduced package size and manufacturing cost by eliminating spacer layers in die stacks. Another advantage is provided by improved heat dissipation due to thermal conductivity between stacked dies. Another advantage is provided by an electrical connection between the stacked dies without requiring wire bonding.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
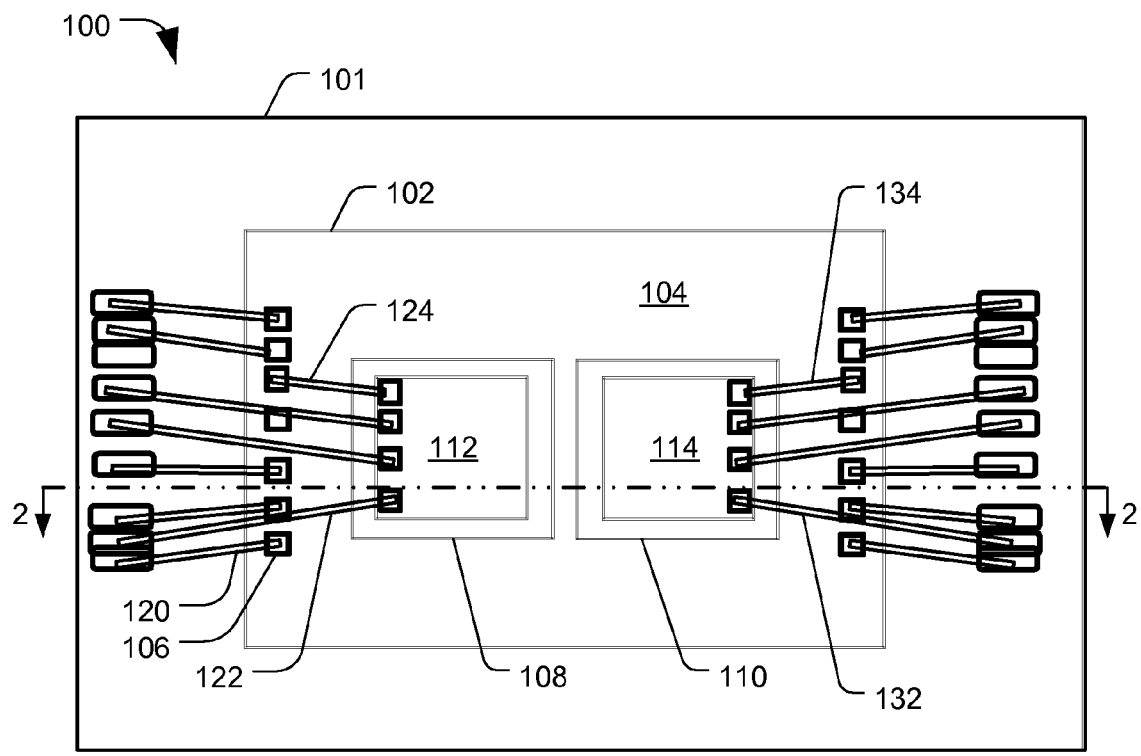
FIG. 1 is a top view of a first illustrative embodiment of a die stacking system.

Referring to FIG. 1, a top view of a first illustrative embodiment of a die stacking system is depicted and generally designated 100. The system 100 includes a semiconductor device package substrate 101 coupled to a first die 102 via wire bonds, such as a representative wire bond 120. The first die 102 has a surface that includes a passivation area 104, conductive bond pad areas such as a representative bond pad area 106, a first conductive stacked die receiving area 108, and a second conductive stacked die receiving area 110.

The first conductive stacked die receiving area 108 is sized to receive at least a second die 112. The second conductive stacked die receiving area 110 is sized to receive at least a third die 114. In a particular embodiment, each of the conductive stacked die receiving areas 108 and 110 is larger than a conventional bond pad area, such as the bond pad area 106, and has a conductive area of at least 10,000 square microns. As an illustrative example, one or more of the conductive stacked die receiving areas 108 and 110 may have a substantially square shape with sides approximately 100 microns in length. As used herein, 1 micron=1 micrometer=1 um=0.000001 meters.

In a particular embodiment, the passivation area 104 functions to protect the top surface of the first die 102 and to render the surface electrically inert. For example, the passivation area 104 may include an oxide or SiN layer. The conductive bond pad areas, such as the bond pad area 106, and the conductive stacked die receiving areas 108 and 110 may include conductive material coupled to the surface of the first die 102 and accessible via openings in the passivation area 104.

In a particular embodiment, the first die 102 functions as a host die to the second die 112, the third die 114, or both. The second die 112 is disposed within and in contact with at least a portion of the first conductive stacked die receiving area 108, establishing an electrical connection to the first die 102. The second die 112 may also be coupled to the semiconductor package substrate 101 and to the first die 102 via wire bonds, such as the representative wire bonds 122 and 124, respectively. For example, the second die 112 may be coupled to a system ground via a bottom conductor that is electrically coupled to the first conductive stacked die receiving area 108. The second die 112 may also receive system power and control signals via wire bonds, such as the representative wire bonds 122 and 124.

The third die 114 is disposed within and in contact with at least a portion of the second conductive stacked die receiving area 110, establishing an electrical connection to the first die 102. The third die 114 may also be coupled to the semiconductor package substrate 101 and to the first die 102 via wire bonds, such as the representative wire bonds 132 and 134, respectively. For example, the third die 114 may be coupled to a system ground via a bottom conductor that is electrically coupled to the second conductive stacked die receiving area 110 and may also receive system power and control signals via wire bonds, such as the representative wire bonds 132 and 134.

In a particular embodiment, each die 102, 112, and 114 is adapted to perform separate functions that may interoperate to provide an application-specific package. For example, in a data processing semiconductor package, the first die 102 may include power management circuitry and the second die 114 may include data processing circuitry. For data processing in a mobile environment, the third die 114 may include communication circuitry or modem circuitry. As another example, the first die 102 may include power management circuitry and the second die 114 may include display circuitry to operate a device display.

As specific examples, the first die 102 may include a power management integrated circuit (PMIC). The second and third dies 112 and 114 may include a controller or other processor, an analog-to-digital converter (A/D), a display controller, or any combination thereof. As another example, the system 100 may be designed for mobile communications, and may include a PMIC, radio frequency (RF) circuitry, and a communication processor.

Figure 5:
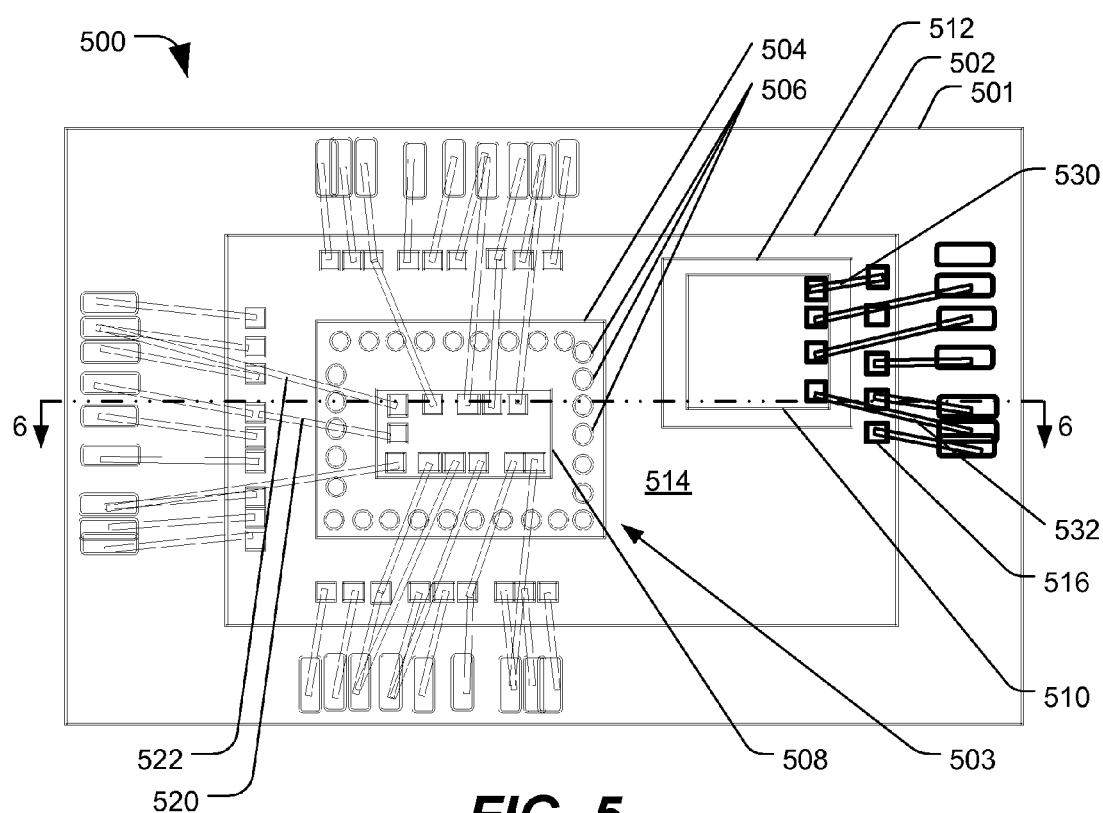
FIG. 5 is a top view of a third illustrative embodiment of a die stacking system.
Figure 6:
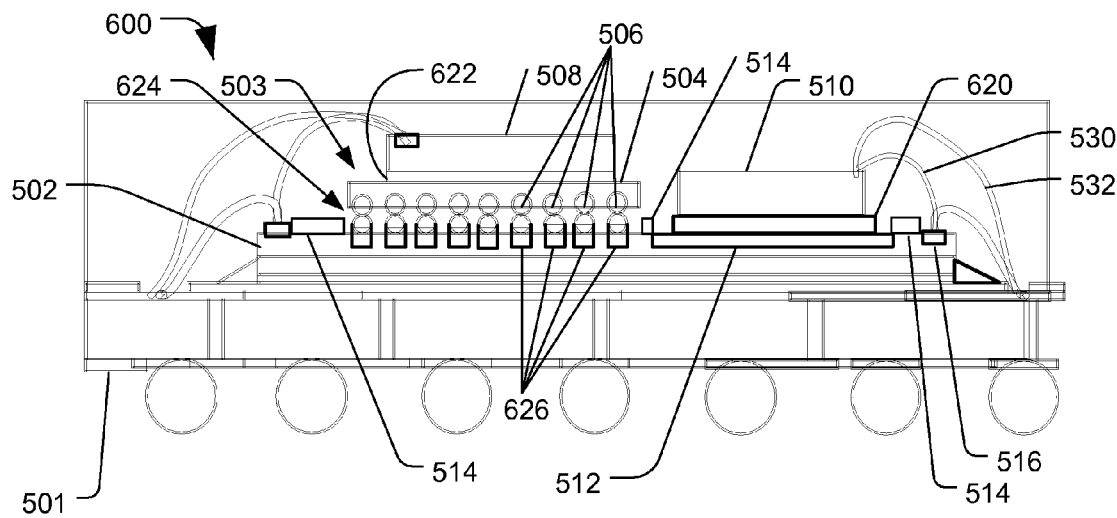
FIG. 6 is a cross-sectional view of the die stacking system of FIG. 5 along the line 5-5.

By coupling the stacked dies 112 and 114 to the conductive die receiving areas 108 and 110 of the first die 102 via openings in the passivation area 104, package height is reduced in comparison to stacking techniques that use spacer layers between dies. Reduced package height may be more pronounced in embodiments having multiple stacked dies, such as an alternative embodiment that includes a fourth die (not shown) coupled to the second die 112. An embodiment that includes multiple stacked dies is illustrated in FIGS. 5-6.

Figure 2:
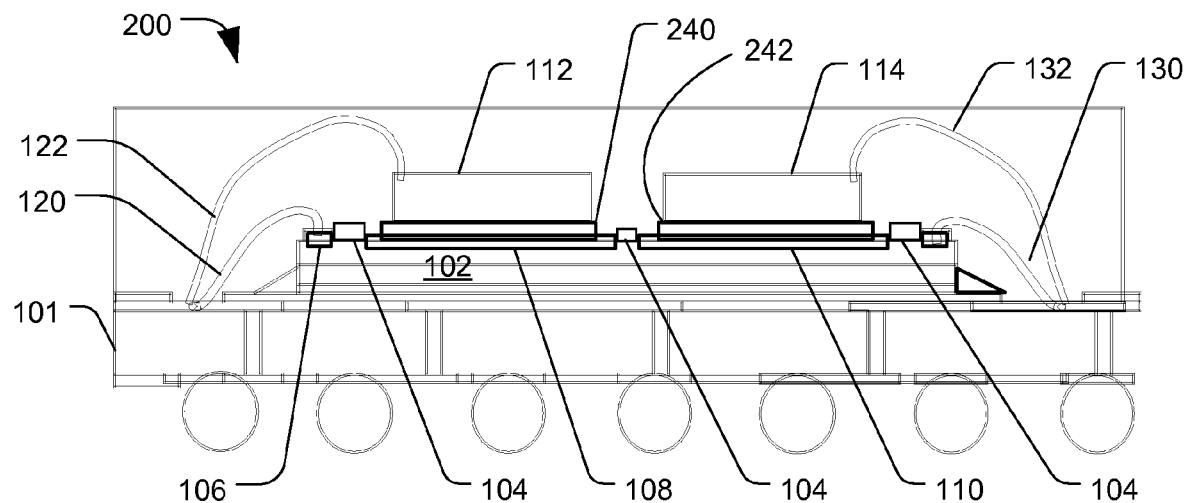
FIG. 2 is a cross-sectional view of the die stacking system of FIG. 1 along the line 2-2.

A cross-sectional view 200 of the die stacking system 100 along the line 2-2 is depicted in FIG. 2. In a particular embodiment, the second die 112 may be fastened to the first die 102 at the first conductive stacked die receiving area 108 via an electrically conductive die attachment material 240. The third die 114 may also be fastened to the second conductive stacked die receiving area 110 via an electrically conductive die attachment material 242. The die attachment material 240, 242 may also be thermally conductive to dissipate heat that is generated at the stacked dies 112 and 114.

Figure 3:
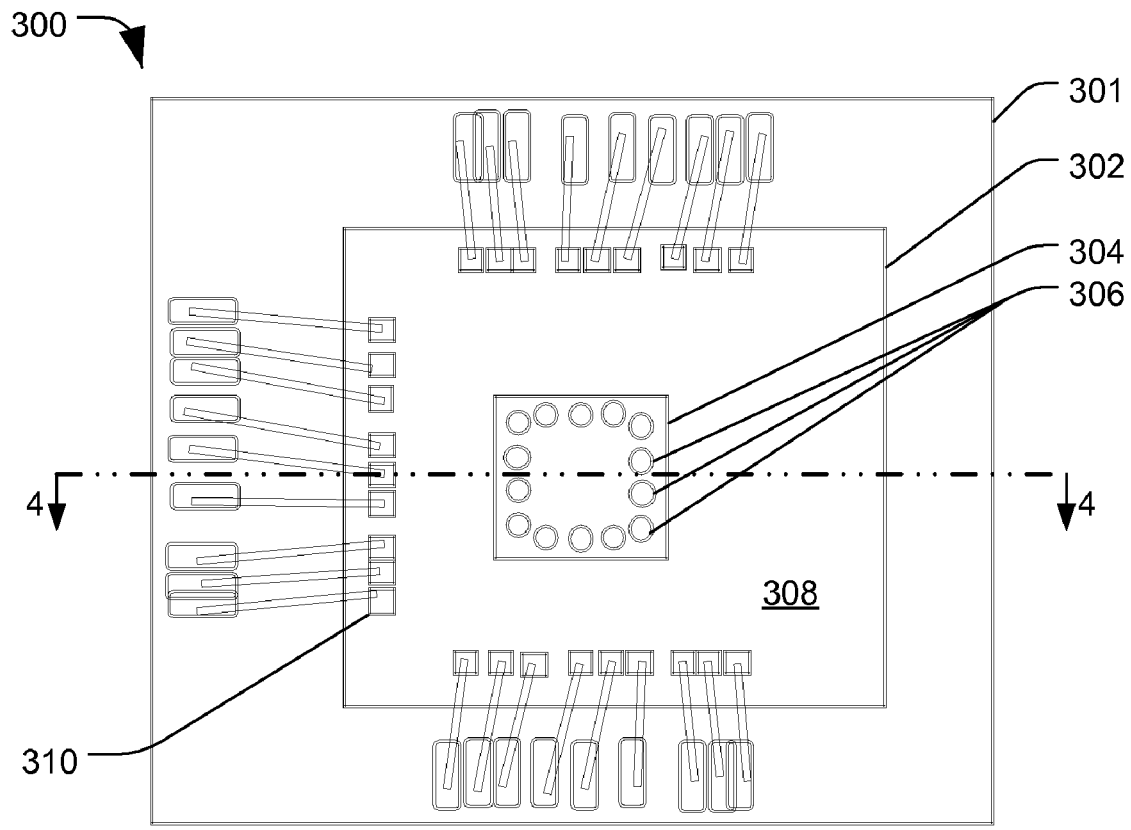
FIG. 3 is a top view of a second illustrative embodiment of a die stacking system.
Figure 4:
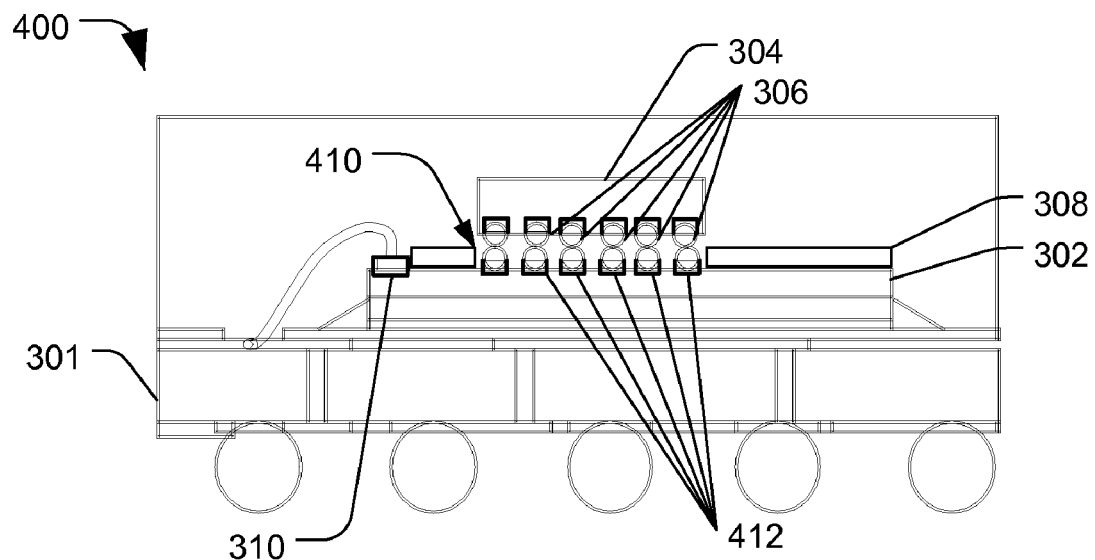
FIG. 4 is a cross-sectional view of the die stacking system of FIG. 3 along the line 4-4.

Referring to FIG. 3, a top view of a second illustrative embodiment of a die stacking system is depicted and generally designated 300. The system 300 includes a package substrate 301 coupled to a first die 302. A second die 304 is coupled to the first die 302 via multiple conductive coupling elements 306. A cross-sectional view 400 of the die stacking system 300 along the line 4-4 is depicted in FIG. 4.

The top surface of the first die 302 includes a passivation area 308, at least one conductive bond pad area 310, and a conductive die receiving area 410 sized to receive one or more of the conductive coupling elements 306 of the second die 304. In a particular embodiment, the passivation area 308 covers the top surface of the first die 302 and forms openings to expose the bond pad areas, such as the conductive bond pad area 310, and to expose the conductive die receiving area 410. In a particular embodiment, the conductive die receiving area 410 has area of at least 10,000 square microns, while each bond pad area, such as the conductive bond pad area 310, is less than 10,000 square microns, such as 500 square microns to 4,000 square microns. In another embodiment, the first die 302 includes multiple conductive die receiving areas, each having an area of at least 10,000 square microns.

The conductive coupling elements 306 are attached to the second die 304 and are electrically coupled to the first die 302 at the conductive stacked die receiving area 410. The conductive coupling elements 306 may include conductive leads, pads, solder balls, pins, studs, other structures to establish a conductive connection, or any combination thereof. In a particular embodiment, the conductive coupling elements 306 are flip-chip bumps.

In a particular embodiment, the first die 302 has multiple electrical contact elements 412 in the conductive die receiving area 410. The electrical contact elements 412 are positioned to contact the conductive coupling elements 306 of the second die 302 when the second die 302 is coupled to the first die 302 in a flip-chip stacked die arrangement. The electrical contact elements 412 may be electrically isolated from one another to enable independent parallel electrical paths between the first die 302 and the second die 304. For example, one or more power supplies and multiple electrical signals may be communicated in parallel between the first die 302 and the second die 304 when each of the electrical contact elements 412 is in contact with a corresponding one of the conductive coupling elements 306.

In a particular embodiment, the first die 302 and the second die 304 may have different yield rates, such as when the first die 302 and the second die 304 are manufactured using different process technologies. For example, the first die 302 may be a complementary metal-on-silicon (CMOS) device, a Silicon on Insulator (SOI) device, a bulk semiconductor device, a Silicon Germanium (SiGe) device, or a Gallium Arsenide (GaAs) device, and the second die 304 may be a different type of device than the first die 302. As a specific example, the first die 302 may be a CMOS type of device and the second die 304 may be a non-CMOS type of device, such as a SOI device, a SiGe device, a GaAs device, or a bulk device, such as a microelectromechanical system (MEMS) device. In a particular embodiment, a stacking order of the dies 302 and 304 for a package may be determined based on the yield rates of the dies 302 and 304. For example, the higher-yield die may be stacked below the lower-yield die to improve overall package yield, cost, manufacture time, or any combination thereof.

Referring to FIG. 5, a top view of a third illustrative embodiment of a die stacking system is depicted and generally designated 500. A flip-chip mounted device 503 includes a first die 508 coupled to a second die 504. The system 500 also includes a third die 502 coupled to the second die 504 and mounted to a substrate 501. A fourth die 510 is coupled to the third die 502. A cross-sectional view 600 of the system 500 along the line 6-6 is depicted in FIG. 6.

The third die 502 acts as a host die for the flip-chip mounted device 503 and the fourth die 510. The top surface of the third die 502 has a passivation area 514 to reduce undesired interactions at the die surface. The passivation area 514 includes openings to provide access to at least one conductive bond pad area 516 and a conductive stacked die receiving area 512. The conductive stacked die receiving area 512 is sized to receive at least the fourth die 510. In a particular embodiment, the conductive stacked die receiving area 512 is sized to receive multiple dies. For example, the conductive stacked die receiving area 512 may include a large electrically and thermally conductive surface coupled to a power supply or system ground and may be large enough to seat multiple dies.

The second die 504 is coupled to the third die 502 via multiple conductive coupling elements 506, such as flip chip bumps, at a second conductive stacked die receiving area 624 that is accessible to the second die 504 via an opening in the passivation layer 514. The second conductive stacked die receiving area 624 includes multiple contacts 626 arranged to couple to the conductive coupling elements 506. In a particular embodiment, the bottom surface of the second die 504 directly contacts at least a portion of the second conductive stacked die receiving area 624 without use of a spacer layer. The second die 504 is not coupled to the third die 502 via wire bonds. In an alternative embodiment, the second die 504 may be coupled to a host die via one or more wire bonds in addition to the multiple conductive coupling elements 506.

The first die 508 is coupled to the second die 504 via a die attachment material 622. In a particular embodiment, the die attachment material 622 is a thermally conductive adhesive material. Wire bonds couple the first die 508 to bond pads of the third die 502 and to bond pads of the substrate 501, such as the representative wire bonds 520 and 522, respectively. In addition, the first die 508 may be electrically coupled to the second die 504 via the die attachment material 622. For example, the die attachment material 622 may provide an electrical contact between a conductive area on the top surface of the second die 504 and a conductive area on the bottom surface of the first die 508. Examples of die attachment materials include polymer adhesives and die attach alloys.

The fourth die 510 is electrically and mechanically coupled to the conductive stacked die receiving area 512 via a conductive die attachment material 620. The fourth die 510 is also coupled to wire bond pads of the third die 502, such as the conductive pad area 516, via wire bonds, such as the representative wire bond 530. In addition, the fourth die 510 is also coupled to wire bond pads of the substrate 501 via wire bonds, such as the representative wire bond 532.

Figure 7:
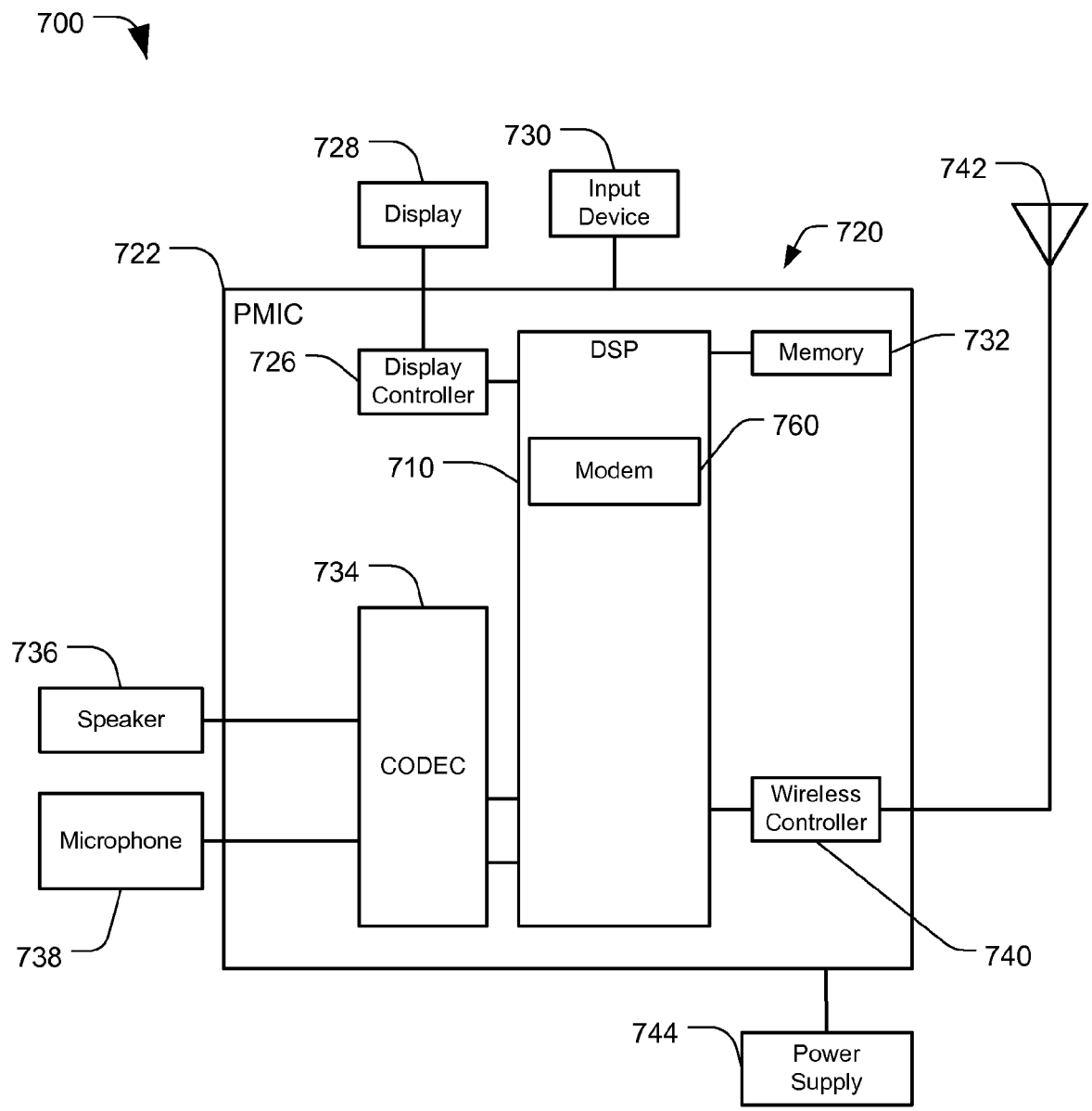
FIG. 7 is a block diagram of a communication device that includes stacked dies.

Referring to FIG. 7, a block diagram of a communication device including stacked dies is depicted and generally designated 700. The communications device 700 includes a chip set 720 that includes a first die, such as a die that includes a power management integrated circuit (PMIC) 722. The chip set 720 also includes at least a second die, such as a die that includes a digital signal processor (DSP) 710, stacked on the first die. In a particular embodiment, the DSP 710 is coupled to a conductive die receiving area of the PMIC 722, as described with respect to FIGS. 1-6.

A display controller 726 can be coupled to the digital signal processor 710 and to a display 728. Additionally, a memory 732 is coupled to the digital signal processor 710. A coder/decoder (CODEC) 734 can also be coupled to the digital signal processor 710. A speaker 736 and a microphone 738 can be coupled to the CODEC 734. Further, a wireless controller 740 can be coupled to the digital signal processor 710 and to a wireless antenna 742. A modem 760 can also be coupled to the DSP 710.

In a particular embodiment, the DSP 710, the display controller 726, the memory 732, the CODEC 734, the wireless controller 740, the modem 760, or any combination thereof, may include a stacked die or flip-chip coupled to the PMIC 722, as described with respect to FIGS. 1-6. In addition, the communications device 700 may include one or more stacks of multiple dies. For example, the DSP 710 may be stacked on the PMIC 722, and the modem 760 may be stacked on the DSP 710.

In a particular embodiment, a power supply 744 and an input device 730 are coupled to the PMIC 722. Moreover, in a particular embodiment, as illustrated in FIG. 7, the display 728, the input device 730, the speaker 736, the microphone 738, the wireless antenna 742, and the power supply 744 are each coupled to a component of the chip set 720.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A semiconductor device comprising:
a first die having a surface that includes a passivation surface, a bond pad surface, and a conductive die receiving surface, wherein the conductive die receiving surface has an electrically conductive surface area that is larger than a footprint of a second die electrically coupled thereto.

2. The device of claim 1, wherein the electrically conductive surface area is at least 10,000 square microns.

3. The device of claim 1, where the first die is integrated into a device selected from the group consisting of a set top box, a music player, a video player, an entertainment unit, a navigation device, a communications device, a personal digital assistant (PDA), a fixed location data unit, and a computer.

4. The device of claim 1, wherein the electrically conductive surface area is configured to supply a system ground.

5. A system comprising:
a first die having a surface that includes a passivation surface, a bond pad surface, and a conductive stacked die receiving surface, wherein the conductive stacked die receiving surface has an electrically conductive surface area that is larger than a footprint of a second die electrically coupled thereto.

6. The system of claim 5, wherein the conductive stacked die receiving surface is an electrically conductive layer.

7. The system of claim 5, where the first die is integrated into a device selected from the group consisting of a set top box, a music player, a video player, an entertainment unit, a navigation device, a communications device, a personal digital assistant (PDA), a fixed location data unit, and a computer.

8. The system of claim 5, wherein the electrically conductive surface area is larger than the footprint of the second die when the second die is in direct contact with the conductive die receiving area.

9. The system of claim 5, wherein the conductive stacked die receiving surface has a substantially square shape with sides approximately 100 microns in length, and wherein each side of the second die is less than 100 microns in length.

10. A device comprising:
a first die having a surface that includes a passivation surface, a bond pad surface, and a conductive die receiving surface, wherein the conductive die receiving surface has an electrically conductive surface area that is larger than a footprint of a second die electrically coupled thereto.

11. The device of claim 10, further comprising a plurality of conductive die receiving surfaces each having a conductive area of at least 10,000 square microns.

12. The device of claim 10, wherein the conductive bond pad surface has an area less than 10,000 square microns.

13. The device of claim 10, wherein the first die is one of a complementary metal-on-silicon (CMOS) device, a Silicon on insulator (SOI) device, a bulk semiconductor device, a Silicon Germanium device, and a Gallium Arsenide device, and wherein the second die is a different type of device than the first die.

14. The device of claim 10, wherein the first die has a first yield rate and the second die has a second yield rate.

15. The device of claim 10, where the first die is integrated into another device selected from the group consisting of a set top box, a music player, a video player, an entertainment unit, a navigation device, a communications device, a personal digital assistant (PDA), a fixed location data unit, and a computer.

16. The device of claim 10, wherein the electrically conductive surface area is configured to supply a system ground.

17. The system of claim 10, wherein at least one wire bond electrically couples the bond pad surface to an electrical contact on a surface of the second die, wherein the surface of the second die opposes the conductive die receiving surface.

18. A package that includes a plurality of semiconductor devices, the package comprising:
a first die having a surface that includes a passivation surface, a bond pad surface, a first conductive die receiving surface, wherein the first conductive die receiving surface has an electrically conductive surface area that is larger than a footprint of a second die electrically coupled thereto, and a second conductive die receiving surface, wherein the second conductive die receiving surface has a second electrically conductive surface area that is larger than a footprint of a third die electrically coupled thereto.

19. The package of claim 18, wherein the first die includes power management circuitry and the second die includes data processing circuitry.

20. The package of claim 18, wherein the third die includes communication circuitry.

21. The package of claim 18, further comprising a fourth die coupled to the second die.

22. The package of claim 18, wherein the first die includes power management circuitry and the second die includes display circuitry.

23. The package of claim 18, wherein the package is integrated into a device selected from the group consisting of a set top box, a music player, a video player, an entertainment unit, a navigation device, a communications device, a personal digital assistant (PDA), a fixed location data unit, and a computer.

24. A system comprising:
a flip chip mounted device including a first die coupled to a second die; and
a third die coupled to the second die, the third die having a surface that includes a passivation surface, a bond pad surface, and a conductive die receiving surface, wherein the conductive die receiving surface has an electrically conductive surface area that is larger than a footprint of a fourth die.

25. The system of claim 24, wherein the second die has a surface that contacts at least a portion of a second conductive stacked die receiving area of the third die.

26. The system of claim 24, wherein the first flip chip mounted device is integrated into a device selected from the group consisting of a set top box, a music player, a video player, an entertainment unit, a navigation device, a communications device, a personal digital assistant (PDA), a fixed location, data unit, and a computer.

27. A semiconductor device comprising:
first die means having a surface that includes a passivation surface, a bond pad surface, and a conductive die receiving surface, wherein the conductive die receiving surface has an electrically conductive surface area that is larger than a footprint of second die means electrically coupled thereto wherein the conductive die receiving surface is larger than the bond pad surface.

28. The device of claim 27, wherein the electrically conductive surface area is at least 10,000 square microns.

29. The device of claim 27, further comprising a second conductive die receiving surface having a second electrically conductive surface area of at least 10,000 square microns.

30. The device of claim 29, wherein the second electrically conductive surface area is larger than a footprint of third die means to be electrically coupled thereto.

31. The device of claim 30, wherein the third die means includes communication circuitry.

32. The device of claim 30, further comprising fourth die means coupled to the second die means.

33. The device of claim 27, wherein the second die means is electrically connected to the first die means.

34. The device of claim 27, wherein the first die means is one of a complementary metal-on-silicon (CMOS) device, a Silicon on insulator (SOI) device, a bulk semiconductor device, a Silicon Germanium device, and a Gallium Arsenide device, and wherein the second die means is a different type of device than the first die means.

35. The device of claim 34, wherein the first die means is a CMOS type of device and the second die means is a non-CMOS type of device.

36. The device of claim 27, wherein the first die means has a first yield rate and the second die means has a second yield rate.

37. The device of claim 27, wherein the first die means includes power management circuitry and the second die means includes data processing circuitry.

38. The device of claim 27, wherein the first die means includes power management circuitry and the second die means includes display circuitry.

39. The device of claim 27, wherein the device is integrated into a device selected from the group consisting of a set top box, a music player, a video player, an entertainment unit, a navigation device, a communications device, a personal digital assistant (PDA), a fixed location data unit, and a computer.

* * * * *

UNITED STATES PATENT AND TRADEMARK OFFICE
CERTIFICATE OF CORRECTION

| | | |
|---|---|---|
| PATENT NO. | : 7,872,356 B2 | |
| APPLICATION NO. | : 11/964188 | |
| DATED | : January 18, 2011 | |
| INVENTOR(S) | : Henry Sanchez and Laxminarayan Sharma | |

It is certified that error appears in the above-identified patent and that said Letters Patent is hereby corrected as shown below:

On the Title Page, Item (75), Inventor "Hen Sanchez" should be listed as "Henry Sanchez." Therefore, Title Page, Item (75) should be listed as follows:

Item (75)   Inventors:   Henry Sanchez, Carlsbad, CA (US);
Laxminarayan Sharma, San Diego, CA (US)

Signed and Sealed this
Eighth Day of March, 2011

David J. Kappos
*Director of the United States Patent and Trademark Office*